United States Patent
Hawes et al.

(10) Patent No.: US 10,778,124 B2
(45) Date of Patent: Sep. 15, 2020

(54) INTEGRATED MONITORING OF AN ELECTRIC MOTOR ASSEMBLY

(71) Applicant: General Electric Company, Schenectady, NY (US)

(72) Inventors: Nathaniel Benedict Hawes, Ballston Spa, NY (US); Stefan Grubic, Hermosa Beach, CA (US); Prabhakar Neti, Rexford, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/442,068

(22) Filed: Feb. 24, 2017

(65) Prior Publication Data

US 2018/0248500 A1    Aug. 30, 2018

(51) Int. Cl.
| | |
|---|---|
| H02K 5/132 | (2006.01) |
| H02P 6/15 | (2016.01) |
| G01R 31/34 | (2020.01) |
| H02P 27/04 | (2016.01) |
| H02P 29/024 | (2016.01) |

(52) U.S. Cl.
CPC ............ *H02P 6/153* (2016.02); *G01R 31/343* (2013.01); *H02K 5/132* (2013.01); *H02P 27/04* (2013.01); *H02P 29/024* (2013.01)

(58) Field of Classification Search
CPC ........ H02P 6/153; G01R 31/343; H02K 5/132
USPC ................................................... 318/400.14
See application file for complete search history.

(56) References Cited

U.S. PATENT DOCUMENTS

| | | | |
|---|---|---|---|
| 4,047,083 A | 9/1977 | Plunkett | |
| 4,330,740 A | 5/1982 | Shell et al. | |
| 4,410,845 A | 10/1983 | Lockyear | |
| 5,198,734 A | 3/1993 | Johnson | |
| 5,915,883 A | 6/1999 | Kuehn | |
| 6,113,355 A | 9/2000 | Hult et al. | |
| 6,239,513 B1 * | 5/2001 | Dean | H02J 9/066 307/64 |
| 6,242,884 B1 | 6/2001 | Lipo et al. | |
| 6,264,431 B1 | 7/2001 | Triezenberg | |

(Continued)

FOREIGN PATENT DOCUMENTS

| | | |
|---|---|---|
| CN | 2739162 Y | 11/2005 |
| CN | 103414424 A | 11/2013 |

(Continued)

OTHER PUBLICATIONS

U.S. Appl. No. 14/946,513, filed Nov. 19, 2015, Nathaniel Benedict Hawes.

(Continued)

*Primary Examiner* — Kawing Chan
(74) *Attorney, Agent, or Firm* — Laura L. Pollander

(57) ABSTRACT

A method of controlling an electric motor assembly includes receiving sensor feedback that is based at least in part on electrical properties of a variable frequency power signal provided to the electric motor assembly. The method also includes adjusting the phase angle of the variable frequency power signal provided to the electric motor assembly based at least in part on the sensor feedback. The method also includes determining an operational status of the electric motor assembly that receives the variable frequency power signal based at least in part on the sensor feedback.

17 Claims, 6 Drawing Sheets

(56) References Cited

U.S. PATENT DOCUMENTS

| | | | |
|---|---|---|---|
| 6,369,534 B1 | 4/2002 | Menegoli | |
| 6,388,353 B1 | 5/2002 | Liu et al. | |
| 6,531,842 B2 | 3/2003 | LeDoux et al. | |
| 6,700,762 B2 | 3/2004 | Underwood et al. | |
| 6,763,622 B2 | 7/2004 | Schulz et al. | |
| 6,831,430 B2* | 12/2004 | Edelson | H02K 3/28 318/400.01 |
| 6,856,109 B2 | 2/2005 | Ho | |
| 6,940,249 B2 | 9/2005 | Toyoda | |
| 7,152,682 B2 | 12/2006 | Hopper | |
| 7,170,262 B2 | 1/2007 | Pettigrew | |
| 7,202,619 B1 | 4/2007 | Fisher | |
| 7,330,779 B2 | 2/2008 | Schulz | |
| 7,835,887 B2 | 11/2010 | Abbata et al. | |
| 7,971,650 B2 | 7/2011 | Yuratich et al. | |
| 7,979,240 B2 | 7/2011 | Fielder | |
| 8,334,666 B2 | 12/2012 | Plitt et al. | |
| 8,456,116 B2 | 6/2013 | Burdick | |
| 8,624,530 B2 | 1/2014 | Chung et al. | |
| 8,892,263 B1* | 11/2014 | Morris | F04D 15/0218 417/36 |
| 9,054,615 B2 | 6/2015 | Head et al. | |
| 9,057,256 B2 | 6/2015 | Ige et al. | |
| 9,209,735 B2 | 12/2015 | Kanchan | |
| 9,595,903 B2* | 3/2017 | Hawes | F04B 47/06 |
| 2004/0104700 A1* | 6/2004 | Edelson | H02K 3/28 318/437 |
| 2008/0187444 A1 | 8/2008 | Molotkov et al. | |
| 2008/0232977 A1* | 9/2008 | Pan | F04B 49/065 417/44.11 |
| 2009/0033251 A1 | 2/2009 | Perisic et al. | |
| 2010/0166570 A1* | 7/2010 | Hampton | F04B 49/065 417/36 |
| 2010/0169030 A1* | 7/2010 | Parlos | G01H 1/00 702/58 |
| 2010/0330853 A1 | 12/2010 | Bisht et al. | |
| 2011/0288703 A1 | 11/2011 | Kalkenstein et al. | |
| 2012/0319628 A1* | 12/2012 | Rongve | H02P 23/14 318/400.02 |
| 2013/0235494 A1 | 9/2013 | Holce et al. | |
| 2014/0009003 A1* | 1/2014 | Ballantine | H01M 8/04 307/154 |
| 2014/0158320 A1 | 6/2014 | Archer et al. | |
| 2014/0167810 A1* | 6/2014 | Neti | G01R 31/34 324/765.01 |
| 2014/0352444 A1* | 12/2014 | Nicq | G01H 1/003 73/660 |
| 2015/0115850 A1 | 4/2015 | Laursen | |
| 2015/0180367 A1* | 6/2015 | Tesch | H02M 7/493 363/95 |
| 2016/0041216 A1 | 2/2016 | Tang et al. | |
| 2016/0041228 A1 | 2/2016 | Gerada | |
| 2016/0276970 A1 | 9/2016 | Hawes et al. | |
| 2017/0002635 A1 | 1/2017 | Williams et al. | |
| 2017/0089192 A1* | 3/2017 | Rendusara | E21B 47/0007 |

FOREIGN PATENT DOCUMENTS

| | | |
|---|---|---|
| CN | 103684171 A | 3/2014 |
| CN | 105158627 A | 12/2015 |
| GB | 2378483 A | 2/2003 |
| WO | 2014/209127 A1 | 12/2014 |
| WO | 2015187796 A1 | 12/2015 |
| WO | 2015195520 A1 | 12/2015 |
| WO | 2017/014734 A1 | 1/2017 |

OTHER PUBLICATIONS

U.S. Appl. No. 15/282,321, filed Sep. 30, 2016, Tomas Sadilek.

U.S. Appl. No. 15/282,399, filed Sep. 30, 2016, Kum Kang Huh.

Ernst, Terry, et al.; "Back Spin Control in Progressive Cavity Pump for Oil Well," 2006 IEE/PES Transmission & Distribution Conference and Exposition: Latin America, pp. 1-7, Aug. 15-18, 2006, Caracas.

Huang, Shoudao, et al.; "Maximum torque per ampere and flux-weakening control for PMSM based on curve fitting," 2010IEE Vehicle Power and Propulsion Conference, pp. 1-5, Sep. 1-3, 2010 Lille.

Rabbi, S.F., et al.; "Equivalent Circuit Modeling of a Hysteresis Interior Permanent Magnet Motor for Electric Submersible Pumps," IEE Transactions on Magnetics, vol. PP, Issue 99, p. 1, Feb. 3, 2016.

Sashidhar, S. et al.; "A low-cost semi-modular dual-stack PM BLDC motor for a PV based bore-well submersible pump," International Conference on Electrical Machines (ICEM), Sep. 2014.

Thangadurai et al.; "Measurement of Turbulence Statistics Using Hot Wire Anemometry," International Conferences on Recent Trends in Engineering and Technology, Jul. 19, 2014.

Ernst, T., "Application of multifunction motor protection relays to variable frequency drive connected motors", 87the Annual Conference for Protective Relay Englneers, pp. 279-291 (Mar. 31-Apr. 13, 2014).

International Search Report and Written Opinion issued in connection with corresponding PCT Application No. PCT/US2018/018500 dated Jun. 5, 2018.

Huh, K.K., et al., System and Method for Active Damping of a motor, GE co-pending U.S. Appl. No. 15/634,723, filed Jun. 27, 2017.

* cited by examiner

INTEGRATED MONITORING OF AN ELECTRIC MOTOR ASSEMBLY

BACKGROUND

The subject matter disclosed herein relates to variable frequency drives (VFDs), and more specifically to VFDs for driving electric machines used with electric submersible pumps (ESPs) in oil and gas applications.

In typical oil and gas drilling applications a well bore is drilled to reach a reservoir. The well bore may include multiple changes in direction and may have sections that are vertical, slanted, or horizontal. A well bore casing is inserted into the well bore to provide structure and support for the well bore. The oil, gas, or other fluid deposit is then pumped out of the reservoir, through the well bore casing, and to the surface, where it is collected. One way to pump the fluid from the reservoir to the surface is with an electrical submersible pump (ESP), which is driven by an electric motor (e.g., an induction motor or a permanent magnet motor) in the well bore casing. Unscheduled downtime of the ESP or electric motor may incur costs for diagnosis of the downtime, replacement of components, maintenance, deferred production, or any combination thereof.

BRIEF DESCRIPTION

Certain embodiments commensurate in scope with the original claims are summarized below. These embodiments are not intended to limit the scope of the claims, but rather these embodiments are intended only to provide a brief summary of possible forms of the claimed subject matter. Indeed, the claims may encompass a variety of forms that may be similar to or different from the embodiments set forth below.

In one embodiment, a method of controlling an electric motor assembly includes receiving sensor feedback that is based at least in part on electrical properties of a variable frequency power signal provided to the electric motor assembly. The method also includes adjusting the phase angle of the variable frequency power signal provided to the electric motor assembly based at least in part on the sensor feedback. The method also includes determining an operational status of the electric motor assembly that receives the variable frequency power signal based at least in part on the sensor feedback.

In another embodiment, a control system includes a primary variable frequency drive (VFD) synchronization circuitry configured to receive a stepped up AC signal from a transformer. The primary VFD is configured to receive power from a power source and to output a variable voltage and variable amplitude AC signal to the transformer configured to output the stepped up AC signal. The synchronization circuitry includes one or more sensors configured to measure one or more electrical properties of the stepped up AC signal, and a controller coupled to the one or more sensors. The controller is configured to directly adjust or to indirectly adjust the phase angle of the stepped up AC signal. The controller is configured to determine an operation status of an electric motor system that receives the AC signal based at least in part on the measured one or more electrical properties of the stepped up AC signal.

In another embodiment, a non-transitory computer readable media includes instructions to be executed by a processor of an electric motor control system. The instructions include instructions to receive sensor feedback that is based at least in part on electrical properties of a variable frequency power signal provided to an electric motor assembly. The instructions include instructions to adjust the phase angle of the variable frequency power signal provided to the electric motor assembly based at least in part on the sensor feedback. The instructions also include instructions to determine an operational status of the electric assembly that receives the variable frequency power signal based at least in part on the sensor feedback.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Electric motor systems may be used to drive various loads. A variable frequency drive (VFD) system for electric motors may reduce the energy used to drive the load. Monitoring and diagnostics of the VFD system and the driven load may improve the availability of operational equipment in the field through the prediction of the remaining lifetime of components of the VFD system or the driven load. Synchronization circuitry may be used with the VFD system to adjust the phase of the driven load, such as a motor of an electrical submersible pump (ESP). The integration of monitoring and diagnostic algorithms with the synchronization circuitry may provide additional functionality to the synchronization circuitry without the addition of components to the system. In some embodiments, the monitoring and diagnostic algorithms may use electronic signature analysis (ESA), high frequency injection (HFI) methods, or any combination thereof to determine an operational status of one or more component of the electric motor system.

Figure 1:
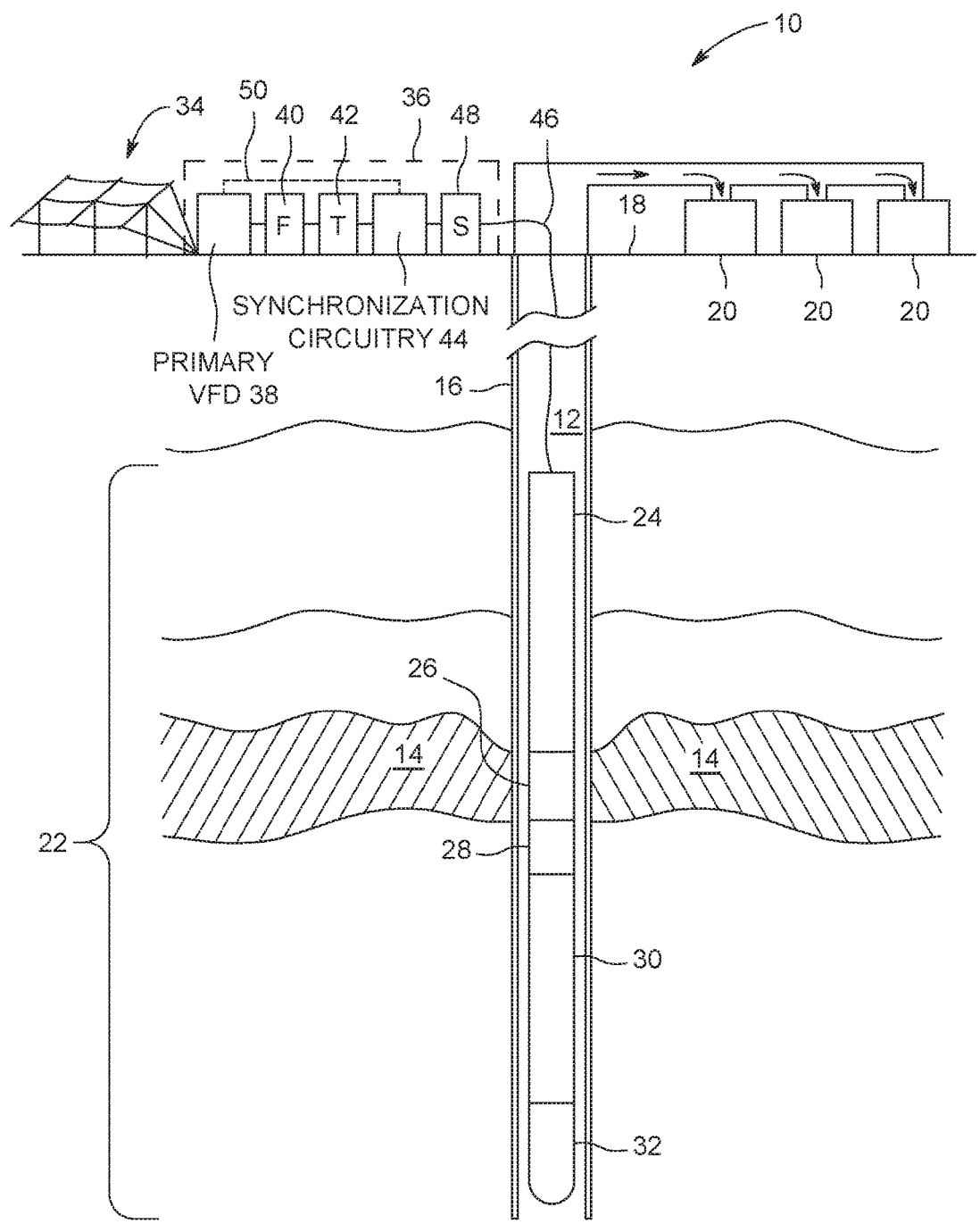
FIG. 1 is a schematic of a hydrocarbon extraction system extracting fluid from an underground reservoir in accordance with aspects of the present disclosure.

Turning to the drawings, FIG. 1 is a schematic of a hydrocarbon extraction system (e.g., well 10) extracting fluid deposits (e.g., oil, gas, etc.) from an underground reservoir 14. As shown in FIG. 1, a well bore 12 may be drilled in the ground toward a fluid reservoir 14. Though the well bore 12 shown in FIG. 1 is a vertical well bore 12, well bores 12 may include several changes in direction and may include slanted or horizontal sections. A well bore casing 16 is typically inserted into the well bore 12 to provide support. Fluid deposits from the reservoir 14, may then be pumped to the surface 18 for collection in tanks 20, separation, transportation, and refining. Though there are many possible ways to pump fluids from an underground reservoir 14 to the surface 18, one technique is to use an electrical submersible pump (ESP), as shown in FIG. 1.

When using an ESP, an ESP assembly or system 22 is fed through the well bore casing 16 toward the reservoir 14. The ESP assembly 22 may include a pump 24, an intake 26, a sealing assembly 28, an electric motor 30, and a sensor 32. Power may be drawn from a power source 34 and provided to the electric motor 30 by an ESP control system 36. The power source 34 shown in FIG. 1 is a utility grid, but power may be provided in other ways (e.g., generator, batteries, etc.). The ESP control system 36 may include a primary variable frequency drive (VFD) 38, a filter 40, a transformer 42, synchronization circuitry 44, and a cable 46. In some embodiments, one or more sensors 48 are coupled to the cable 46 to measure one or more electrical properties (e.g., voltage, current, inductance, capacitance, impedance) of the variable frequency power signal on the cable 46. It should be understood, however, that FIG. 1 shows one embodiment, and that other embodiments may omit some elements or have additional elements. The primary VFD 38 receives power from the power source 34 and synthesizes the variable frequency, variable amplitude, AC voltage that drives the motor. In some embodiments, the power output by the primary VFD 38 may be filtered by filter 40. In the present embodiment, the filter 40 is a sine wave filter. However, in other embodiments, the filter may be a low pass filter, a band pass filter, or some other kind of filter. The power may then be stepped up or down by a transformer 42. In the present embodiment, a step up transformer is used for efficient transmission down the well bore 12 to the ESP assembly 22, however, other transformers or a plurality of transformers may be used. The ESP control system 36 provides power to the motor 30 via the cable 46 to drive the pump 24. The motor 30 may be an induction motor, a permanent magnet motor, or any other type of electric motor.

The motor 30 (e.g., permanent magnet motor) may more efficiently convert the power from the cable 46 to mechanical energy when a rotor position of the motor 30 is synchronized with the phase angle of the current provided to the stator of the motor 30. As discussed in detail below, the synchronization circuitry 44 may directly adjust the phase angle of the current provided via the cable 46 to the motor 30 or indirectly adjust the phase angle of the current provided via the cable through control of the primary VFD 38. In some embodiments, the synchronization circuitry 44 includes a secondary VFD disposed on the high-voltage side of the transformer 42 and configured to deliver full-rated current for a short period of time (e.g., one minute or less) when the electric motor 30 draws more power than the transformer 42 can support for the short period of time. In embodiments with multiple transformers (e.g., a step up transformer 42 at the surface, and a step down transformer in the well bore 12, at the end of the cable 46), the secondary VFD of the synchronization circuitry 44 may be installed between the transformers or at the termination of the second transformer.

In some embodiments, the synchronization circuitry 44 includes a controller configured to provide adjustment signals to the primary VFD 38 via a transmission link 50 to adjust the power output provided by the primary VFD 38 to the transformer 42. As discussed herein, the controller that provides adjustment signals to the primary VFD 38 may be configured as a "virtual encoder" for the primary VFD 38. Suitable transmission links 50 may include wired or wireless connections, and the adjustment signals may be analog adjustment signals or digital adjustment signals.

A variable frequency power output is provided to the ESP assembly 22 via the cable 46 that is fed through the well bore casing 16 from the surface 18 to the ESP assembly 22. The pump 24 may be a centrifugal pump with one or more stages. The intake 26 acts as a suction manifold, through which fluids 14 enter before proceeding to the pump 24. In some embodiments, the intake 26 may include a gas separator. A sealing assembly 28 may be disposed between the intake 26 and the motor 30. The sealing assembly protects the motor 30 from well fluids 14, transmits torque from the motor 30 to the pump 24, absorbs shaft thrust, and equalizes the pressure between the reservoir 14 and the motor 30. Additionally, the sealing assembly 28 may provide a chamber for the expansion and contraction of the motor oil resulting from the heating and cooling of the motor 30 during operation. The sealing assembly 28 may include labyrinth chambers, bag chambers, mechanical seals, or some combination thereof.

The sensor 32 is typically disposed at the base of the ESP assembly 22 and collects real-time system and well bore parameters. Sensed parameters may include pressure, temperature, motor winding temperature, vibration, current leakage, discharge pressure, and so forth. The sensor 32 may provide feedback to the ESP control system 36 and alert users when one or sensed parameters fall outside of expected ranges.

Figure 2:
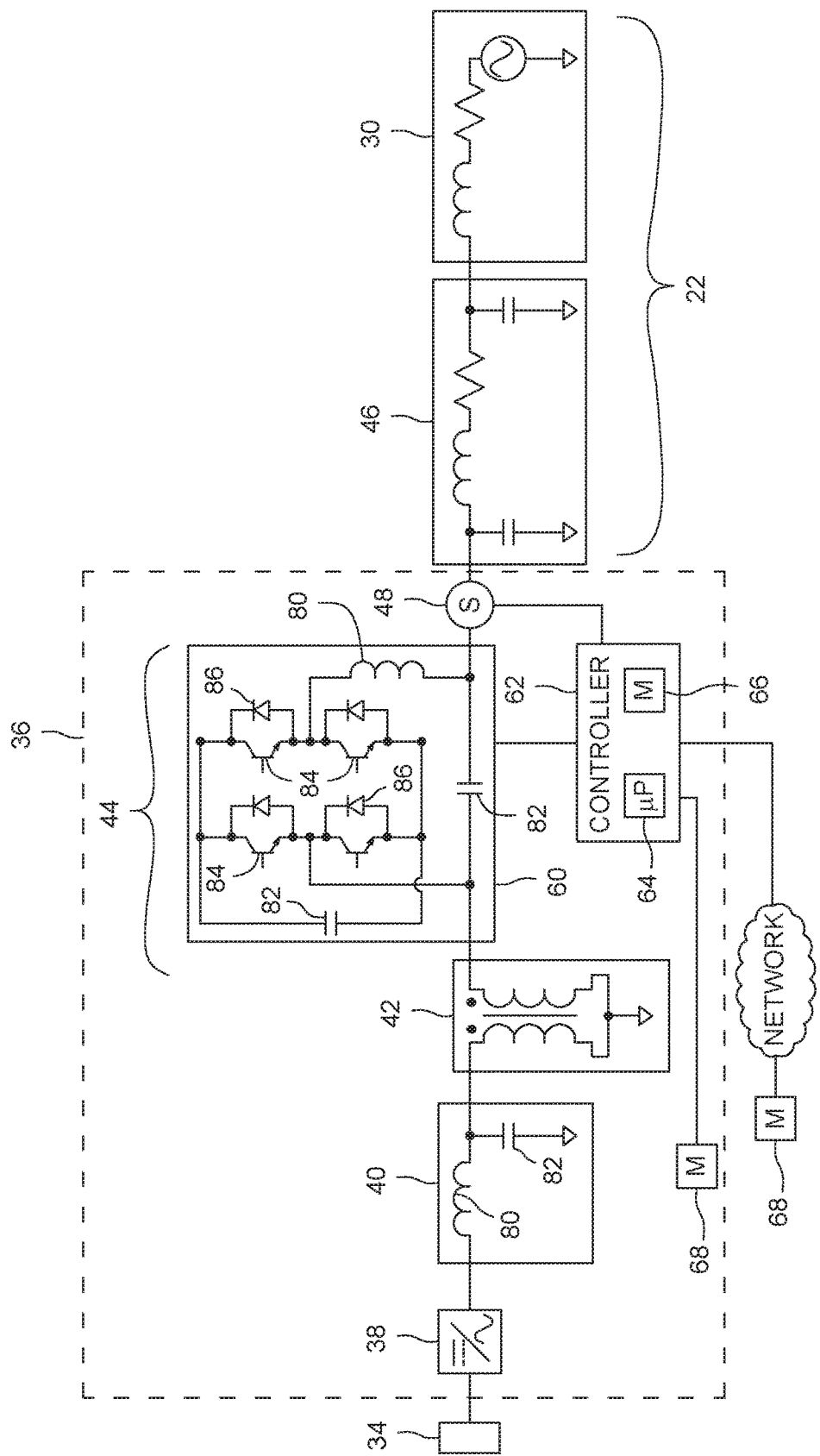
FIG. 2 is a wiring schematic of the electric submersible pump (ESP) control system with a secondary variable frequency drive in accordance with aspects of the present disclosure.

FIG. 2 is a wiring schematic of an embodiment of the ESP control system 36 shown in FIG. 1, where the synchronization circuitry 44 includes a secondary VFD 60. In some embodiments, the secondary VFD 60 is coupled to a controller 62 configured to control the output of the secondary VFD 60 to the cable 46. The controller 62 may include a processor 64 configured to execute instructions from a memory 66 (e.g., a non-transitory, computer readable media). As previously discussed, the primary VFD 38 receives power from a power source 34 (e.g., utility grid, battery, generator, etc.), modifies the power, and outputs a power signal of the desired frequency and amplitude for driving the electric motor 30. The primary VFD 38 may include power electronic switches, current measurement components, voltage measurements components, a process, or other components. The primary VFD 38 is disposed on the primary side (e.g., low voltage side) of the transformer 42 and is programmed to operate the motor 30.

The output from the primary VFD 38 may then be filtered using the filter 40. In the embodiment shown, the filter 40 is a sine wave filter, however in other embodiments, the filter may be any low pass filter, or any other kind of filter. As shown in FIG. 2, the filter 40 may include inductors 80, capacitors 82, or other electrical components. The output from the filter 40 is stepped up using the step up transformer 42. The step up transformer steps up the voltage of the power signal for efficient transmission through the cable 46 to the electric motor 30, which in some applications may as long as 1,000 to 10,000 feet. Magnetic saturation of the transformer 42 for some loading conditions (e.g., startup of a synchronous motor, seizure of the pump, transient load conditions, etc.) with a low frequency and a high torque may prevent the primary VFD 38 and the transformer 42 alone from providing sufficient voltage or magnetic flux to keep the electric motor 30 from stalling.

In order to deal with the magnetic saturation potential of the transformer 42, the synchronization circuitry 44 may include the secondary VFD 60 disposed in series or parallel with the cable 46, on the high voltage secondary side of the transformer 42. The secondary VFD 60 may be configured to deliver full rated current for short periods of time (e.g., less than 1 minute). Because the secondary VFD 60 is on the high voltage side of the transformer, the secondary VFD 60 can provide full rated current for a short period of time (e.g., one minute or less), thus supplementing the voltage of the primary VFD 38 until the motor 30 reaches a high enough frequency for the primary VFD 38 to drive the motor 30 on its own. As previously discussed, the power signal output by the ESP control system 36 is transmitted to the electric motor 30 via the cable 46.

The secondary VFD 60 may interface with only one or all three phases of the system 36. As shown in FIG. 2, the secondary VFD 60 may include transistors 84 (e.g., IGBT or MOSFET), diodes 86, inductors 80, capacitors 82, and any number of other components. The synchronization circuitry 44 may also include power electronic switches, one or more sensors 48 to measure electrical properties on the cable 46 (e.g., current, voltage, impedance, capacitance, inductance), the controller 62 coupled to the one or more sensors 48, the processor 64, the memory 66, and the like. As discussed in detail below, the elements of the synchronization circuitry 44 may be utilized to enable the ESP control system 36 to transmit desired power (e.g., desired frequency, desired voltage, desired current, desired angle), to enable the use of electronic signature analysis (ESA) to monitor the power on the cable 46 at frequencies of interest, or to enable the use of high frequency injection (HFI) methods to monitor the health of components (e.g., insulation) of the motor 30, or any combination thereof. The algorithms executed by the controller 62 for ESA or HFI methods may compare feedback provided by the one or more sensors 48 to data stored in a data storage device 68. The data stored in the data storage device 68 may include reference data, one or more thresholds, a lookup table, data from the coupled hydrocarbon extraction system 10, or data from other hydrocarbon extraction systems 10, or any combination thereof. The data storage device 68 may be the memory 66 of the controller 62, a memory of the ESP control system 36, or a memory coupled to the controller 62 via a network 70. In some embodiments, the network 70 may include, but is not limited to, the Internet, a Local Area Network (LAN), a Wide Area Network (WAN), or a virtual private network.

In some embodiments, the synchronization circuitry 44 may include a filter (e.g., band stop filter) disposed between the secondary VFD 60 and the transformer 42 to reduce or eliminate injected high frequency diagnostic signals from the secondary VFD 60 from passing through the transformer towards the primary VFD 38 or the power source 34. That is, the filter may be directly coupled to the transformer 42. Furthermore, in addition to the single phase H-bridge topology shown in FIG. 2, the secondary VFD 60 may have a single phase half-bridge topology, or a polyphase half-bridge topology. In addition to the series topology, a parallel topology may be employed to couple the secondary VFD 60 to the output of the transformer 42.

Figure 3:
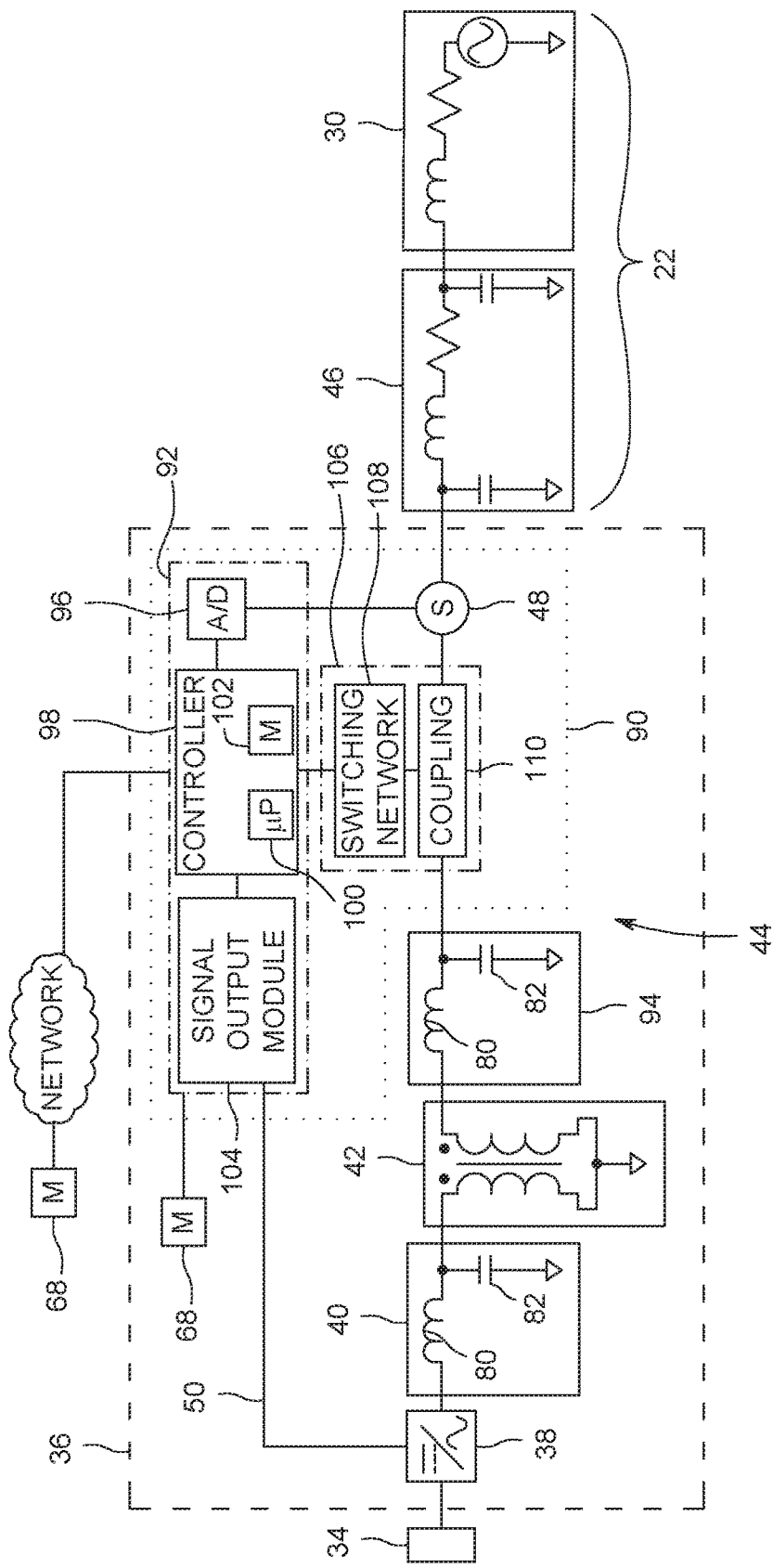
FIG. 3 is a wiring schematic of the ESP control system with a virtual encoder in accordance with aspects of the present disclosure.

FIG. 3 is a wiring schematic of an embodiment of the ESP control system 36 shown in FIG. 1, where the synchronization circuitry 44 includes a virtual encoder 90. As previously discussed, the primary VFD 38 receives power from a power source 34 (e.g., utility grid, battery, generator, etc.), modifies the power, and outputs a power signal of the desired frequency and amplitude for driving the electric motor 30. The primary VFD 38 may include power electronic switches, current measurement components, voltage measurements components, a process, or other components. The primary VFD 38 is disposed on the primary side of the transformer 42 and is programmed to operate the motor 30.

One or more sensors 48 of the virtual encoder 90 of the synchronization circuitry 44 may measure electrical properties on the cable 46 (e.g., current, voltage, impedance, capacitance, inductance, back-electromotive force). The one or more sensors 48 may provide feedback to a digital signal processor 92, which correlates the feedback with a rotor position of the motor 30. The digital signal processor 92 may transmit signals corresponding to the rotor position to the primary VFD 38 via the transmission link 50. The signals transmitted to the primary VFD 38 may adjust one or more properties of the output of the primary VFD 38 including, but not limited to the frequency, the angle, the current, or the voltage, or any combination thereof. The primary VFD 38 may be configured to respond to signals from the digital signal processor 92 as though the signals were from a closed-loop position sensor in the motor 30 itself.

A signal injection module 106 of the virtual encoder 90 may introduce signals (e.g., diagnostic signals, measurement signals) to the cable 46. After introduction of the signals to the cable 46, the one or more sensors 48 measure the effect on the cable 46 and the ESP assembly 22. The feedback from the one or more sensors 48 may be utilized to determine the rotor position at low or zero rotor speeds of the motor 30. A filter 94 (e.g., low pass filter, high pass filter, bandstop filter) may reduce or eliminate injected high frequency diagnostic signals from the secondary VFD 60 from passing through the transformer 42 towards the primary VFD 38 or the power source 34.

The feedback from the one or more sensors 48 may be received by an analog to digital converter 96, which converts the feedback to a digital signal to be received by a controller 98. The controller 98 may have a processor 100 configured to execute instructions stored in a memory 102. The memory 102 may be a non-transitory computer readable medium that may store instructions (e.g., code, software) for implementing an algorithm, such as an algorithm to determine the rotor position of the motor 30 from the feedback of the one or more sensors 48, to control the signal provided to the primary VFD 38 via the transmission link 50, to compare a frequency profile of the variable frequency power signal on the cable 46 to a reference, or to determine an impedance of the ESP assembly 22, or any combination thereof. The algorithms executed by the controller 98 may compare feedback provided by the one or more sensors 48 to data stored in the data storage device 68. As discussed above, the data stored in the data storage device 68 may include reference data, one or more thresholds, a lookup table, data from the coupled hydrocarbon extraction system 10, or data from other hydrocarbon extraction systems 10, or any combination thereof. The data storage device 68 may be the memory 102 of the controller 98, a memory of the ESP control system 36, or a memory coupled to the controller 62 via the network 70.

A signal output module 104 coupled to the controller 98 may provide one or more output signals to the primary VFD 38 via the transmission link 50. The output signals may be sinusoidal output signals, quadrature output signals, or digital output signals, or any combination thereof. The sinusoidal and quadrature output signals may contain rotor position data determined by the controller 98, which may be processed directly by the primary VFD 38 and trigger the appropriate control responses. Similarly, digital output signals may include rotor position format in a digitized format or VFD drive commands in digital format, as when the controller 98 functions as a master controller for the primary VFD 38 to control the output.

In some embodiments, the controller 98 is coupled to the cable 46 via a signal injection module 106. The signal injection module 106 may include a switching network 108 and a coupling 110. During operation of the virtual encoder 90 with the primary VFD 38, a probe signal generated by the controller 98 of the virtual encoder 90 may be transmitted via the switching network 108 to the coupling 110 for injection to the cable 46 and the motor driven by the primary VFD 38. The coupling 110 may be a capacitive coupling, an inductive coupling, or any combination thereof. Moreover, the signal injection module 106 may be configured for one or more of parallel inductive signal injection, series inductive signal injection, parallel capacitive signal injection, direct series signal injection, and direct parallel signal injection individually or in combination.

As discussed above with FIGS. 2 and 3, the synchronization circuitry 44 may adjust the phase angle of the current provided via the cable 46 to the motor 30. The synchronization circuitry may directly adjust the phase angle by control of the secondary VFD 60, or the synchronization circuitry 44 may indirectly adjust the phase angle through control of the primary VFD 38 with the virtual encoder 90. As discussed herein, a dual drive system refers to embodiments of the ESP control system 36 with the primary VFD 38 and the secondary VFD 60. The dual drive system may utilize the secondary VFD 60 to supplement the primary VFD 38, for example, as described in U.S. patent application Ser. No. 14/946,513 entitled "Dual Motor Drive For Electric Submersible Pump Systems", filed Nov. 9, 2015, which is incorporated by reference in its entirety for all purposes. Moreover, as discussed herein, a virtual encoder system refers to embodiments of the ESP control system 36 with the virtual encoder 90 without the secondary VFD 60. The virtual encoder system may utilize the virtual encoder 90 to monitor the power provided to the motor 30 via the cable 46, to determine a rotor angle of the motor 30, and to control the primary VFD 38, for example, as described in U.S. patent application Ser. No. 14/663,691 entitled "Controller For Motor", filed Mar. 20, 2015, which is incorporated by reference in its entirety for all purposes. As discussed in detail below, the synchronization circuitry 44 may utilize feedback from the one or more sensors 48 of the synchronization circuitry 44 for more than adjustment of the phase angle of the current provided by the cable 46 to the motor 30.

In some embodiments, the controller 62 or 98 of the synchronization circuitry 44 may determine the rotor angle from feedback of the one or more sensors 48 based at least in part on a determined motor back-emf voltage, an injected high frequency signal, or any combination thereof. For example, the controller 62 or 98 may measure the current and voltage at the one or more sensors 48, compute the difference between an estimated current and an actual current to determine the motor back-emf voltage. The controller 62 or 98 may utilize the motor back-emf voltage to determine adjustments to the primary VFD 38 or the secondary VFD 60 that would adjust the rotor angle of the motor 30 and drive the difference between the estimated current and the actual current toward zero. To enable low speed and zero speed detection of the rotor angle, the signal injection module 106 or the secondary VFD 60 may inject a probe signal with predetermined voltage and frequency characteristics at a frequency much greater than a fundamental electrical frequency (and its low order harmonics) powering the motor 30. Accordingly, the one or more sensors 48 may measure the response (e.g., motor inductance) from the ESP assembly 22 to determine the rotor angle of the motor 30.

Figure 4:
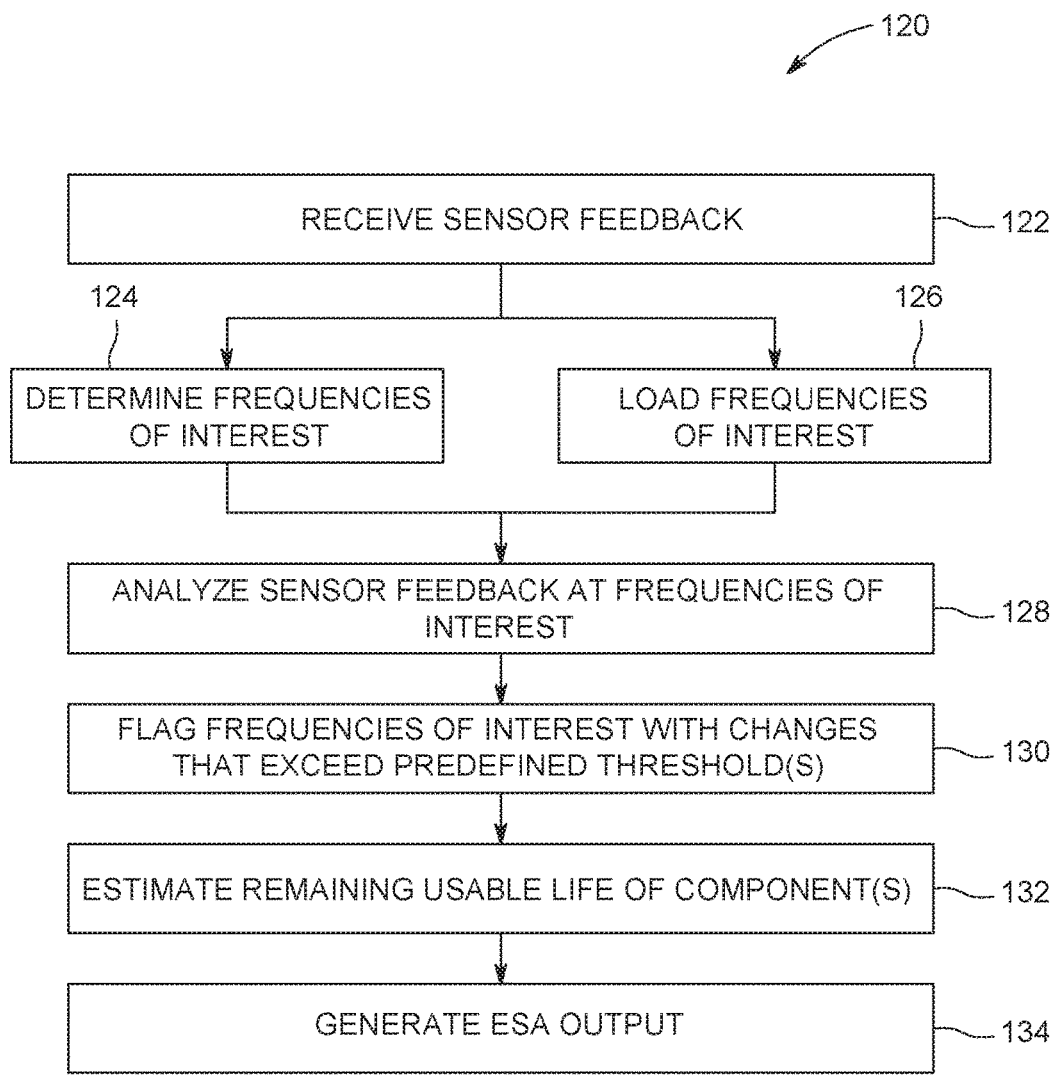
FIG. 4 is a flow chart of a method for using electronic signature analysis (ESA) to monitor the ESP assembly in accordance with aspects of the present disclosure.

Additionally, the controller 62 or 98 may utilize ESA of the feedback from the one or more sensors 48 to monitor particular frequencies of interest to determine an operational status of one or more component of the ESP assembly 22. FIG. 4 illustrates an embodiment of an ESA method 120 with feedback from the one or more sensors 48 to monitor the operational status of the ESP assembly 22. While it is understood that both the controller 62 of embodiments of the dual drive system and the controller 98 of embodiments of the virtual encoder system may utilize the ESA method 120 to monitor the operational status of the ESP assembly 22, the discussion of FIG. 4 below refers to the controller 98 of the virtual encoder system for conciseness.

The controller 98 initiates the ESA method 120 by receiving (block 122) feedback from the one or more sensors 48. The one or more sensors 48 are positioned within the ESP control assembly 36 to provide feedback to the controller 98 regarding the power output provided to the motor 30 via the cable 46. For example, the one or more sensors 48 may be disposed between the secondary VFD 60 and the cable 46, between the signal injection module 106 and the cable 46, or between the transformer 42 and the cable 46. The feedback from the one or more sensors 48 may include measurements of the current, the voltage, the impedance, the capacitance, the inductance, or any combination thereof. For example, the feedback may include measurements of the current provided via the cable 46 for a spectrum of frequencies. The controller 98 may receive the feedback continuously or at discrete times (e.g., periodic intervals, predetermined operating conditions, on demand) during operation of the ESP assembly 22.

In some embodiments, the controller 98 determines (block 124) frequencies of interest for analysis based at least in part on characteristics of the ESP assembly 22. For example, frequencies of interest may include misalignment frequencies ($f_{misalign}$) and rotor bar frequencies ($f_{rotorbar}$), defined in Equations 1 and 2 below:

$$f_{misalign} = 2f\left[1 \pm \frac{k(1-s)}{P}\right] \quad \text{Equation 1}$$

$$f_{rotorbar} = 2f[1 \pm ks] \quad \text{Equation 2}$$

Where f is the fundamental frequency of the motor, s is the slip frequency, p is the number of poles, and k is any positive integer. For example, the determined misalignment frequencies of an embodiment of the ESP assembly 22 with a fundamental frequency of 60 Hz, a slip frequency of 0.9 Hz, and 2 poles may include 120.9 Hz, 119.1 Hz, 121.8 Hz, 118.2 Hz, 124.5 Hz, and 115.5 Hz. Additionally, the determined rotor bar frequencies of that embodiment of the ESP assembly 22 may include 238.2 Hz, 1.8 Hz, 356.4 Hz, 116.4 Hz, 711 Hz, 471 Hz).

In some embodiments, the controller 98 loads (block 126) frequencies of interest from the data storage device 68 (e.g., memory 102) in place of determining the frequencies of interest to execute the ESA method 120. Natural frequencies of components of the ESP assembly 22 may be determined previously and stored in the data storage device 68. Natural frequencies of interest may include rotordynamics natural frequencies, load natural frequencies, and bearing natural frequencies (e.g., fundamental train frequency, ball spin frequency, ball pass frequency (outer race), ball pass frequency (inner race)). In some embodiments, the natural frequencies of components of the ESP assembly 22 may be determined a priori via finite element analysis, a transform matrix method, or another analysis method. The bearing natural frequencies may be determined based at least in part on a rolling element diameter, a pitch diameter, a number of rolling elements, a contact angle, and a speed. Vibrations due to natural frequencies may generate an electrical signal, which can be measured within the current and/or the voltage to the motor 30.

The controller 98 analyzes (block 128) the received sensor feedback at frequencies of interest to determine the operational status of the motor 30 regarding the alignment and the rotor bars. The controller 98 may compare the received sensor feedback at a frequency of interest to prior sensor feedback at the same frequency of interest. The controller 98 may flag (block 130) any frequency of interest with observed changes between the current and prior sensor feedback that exceed a predefined threshold. In some embodiments, the predefined threshold is a current amplitude in decibels (e.g., 3, 5, 10, 15, 20 dB) greater than a noise floor for the current near that frequency of interest.

Figure 5:
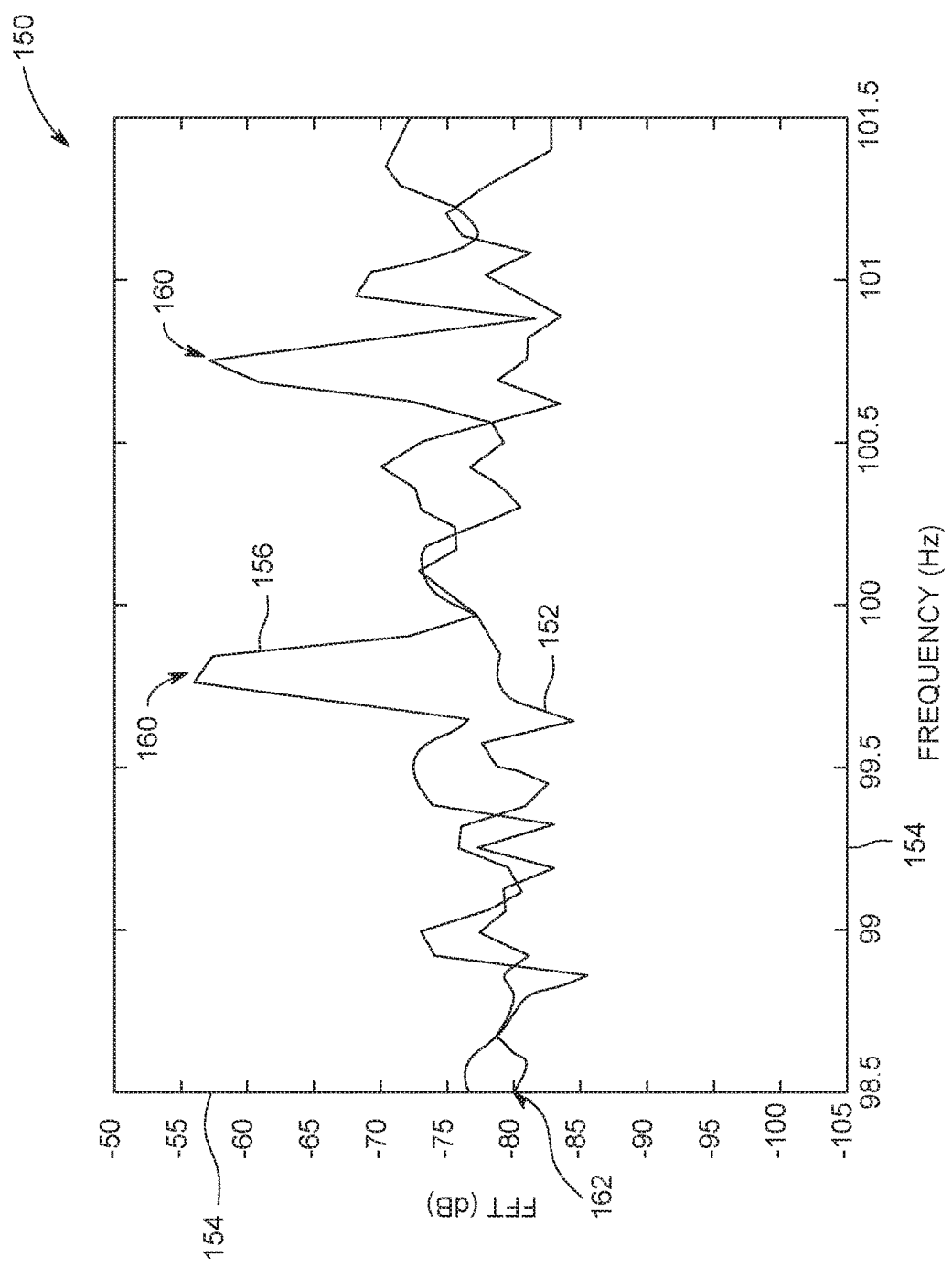
FIG. 5 is a graph that illustrates a comparison of current amplitudes at frequencies of interest for the ESP assembly in accordance with aspects of the present disclosure.

FIG. 5 illustrates a graph 150 with a healthy baseline current 152 over a frequency spectrum and a sensed current feedback 156 over the frequency spectrum that corresponds to a misalignment faults. The Y-axis 154 of the graph 150 illustrates the amplitude in decibels of the baseline current 152 and the sensed current feedback 156, and the X-axis 158 of the graph 150 illustrates a portion of the frequency spectrum 154. Peaks 160 of the sensed current feedback 156 that are approximately 20 to 25 dB greater than the baseline current values at frequencies 99.8 Hz and 100.8 Hz indicate a misalignment fault condition. The peaks 160 of the sensed current feedback 156 are also approximately 20 dB greater than an average 162 of the baseline current values across the frequency spectrum shown in the graph 150. The healthy baseline current 152 used to analyze the frequencies of interest may be based at least in part on a load on the motor 30, the temperature of the motor 30, the speed of the motor 30, operating conditions of the ESP assembly, and other variables. In some embodiments, the controller 98 may flag the frequency of interest according to a magnitude of the difference relative the baseline current values. For example, the controller 98 may generate a first flag in response to sensed current feedback 156 that exceeds a first predefined threshold, and the controller may generate a second flag in response to sensed current feedback 156 that exceeds a second predefined threshold greater than the first predefined threshold. The first flag may correspond to an operational status of the ESP assembly 22 with more frequent monitoring intervals, and the second flag may correspond to a shut-down operational status of the ESP assembly 22 to reduce or eliminate the cost or risk of an unscheduled maintenance period for the ESP assembly 22.

Returning to FIG. 4, the controller 98 may flag (block 130) any frequency of interest with observed changes between the current sensor feedback and a baseline reference at the frequency of interest that are greater than a predefined threshold. In some embodiments, the baseline reference is a sample or an average of samples from a prior monitoring session, such as a monitoring session of the ESP assembly 22 at a known "healthy" operational status. Additionally, or in the alternative, the baseline reference is based at least in part on one or more monitoring sessions of other ESP assemblies 22 with a known "healthy" operational status. That is, the data from monitoring sessions of a fleet of ESP assemblies 22 may be stored and utilized to determine a baseline reference stored in the storage device(s) 68 accessible by the controller 98.

In some embodiments, the controller 98 may determine (block 132) an estimate of the remaining usable life of the component (e.g., rotor bar, rotor, stator) of the ESP assembly 22 based at least in part on analysis (block 128) of the feedback from the one or more sensors 48. For example, the controller 98 may note trends in the feedback at the frequencies of interest and extrapolate based on the designed lifetime of the component or observed lifetime of other similar components.

Upon completion of the analysis (block 128) of the feedback, the controller 98 generates (block 134) an ESA output to be provided to an operator of the ESP assembly 22, an owner of the ESP assembly 22, a manufacturer of the ESP assembly 22, or a servicer of the ESP assembly 22, or any combination thereof. In some embodiments, the controller 98 may transmit the ESA output to the network 70, such as a cloud-based system, the Internet, a virtual private network, and so forth. The ESA output may be provided via an audible message or tone, a visual indicator (e.g., light), a textual message on a display or printout (e.g., email, text message, report), or any combination thereof. In some embodiments, the generated ESA output is an alert to the detection of one or more flagged frequencies of interest and the affected components of the ESP assembly 22. Additionally, or in the alternative, the generated ESA output is an estimate of the remaining usable life of the component (e.g., rotor bar, rotor, stator) of the ESP assembly 22. Moreover, in some embodiments the generated ESA output is an automated request for a replacement part or a maintenance period to address the one or more flagged frequencies of interest. It may be appreciated that the generated ESA output may be any combination of an alert, an estimate of the remaining usable life, a request for a replacement part, or a request for a maintenance period.

Figure 6:
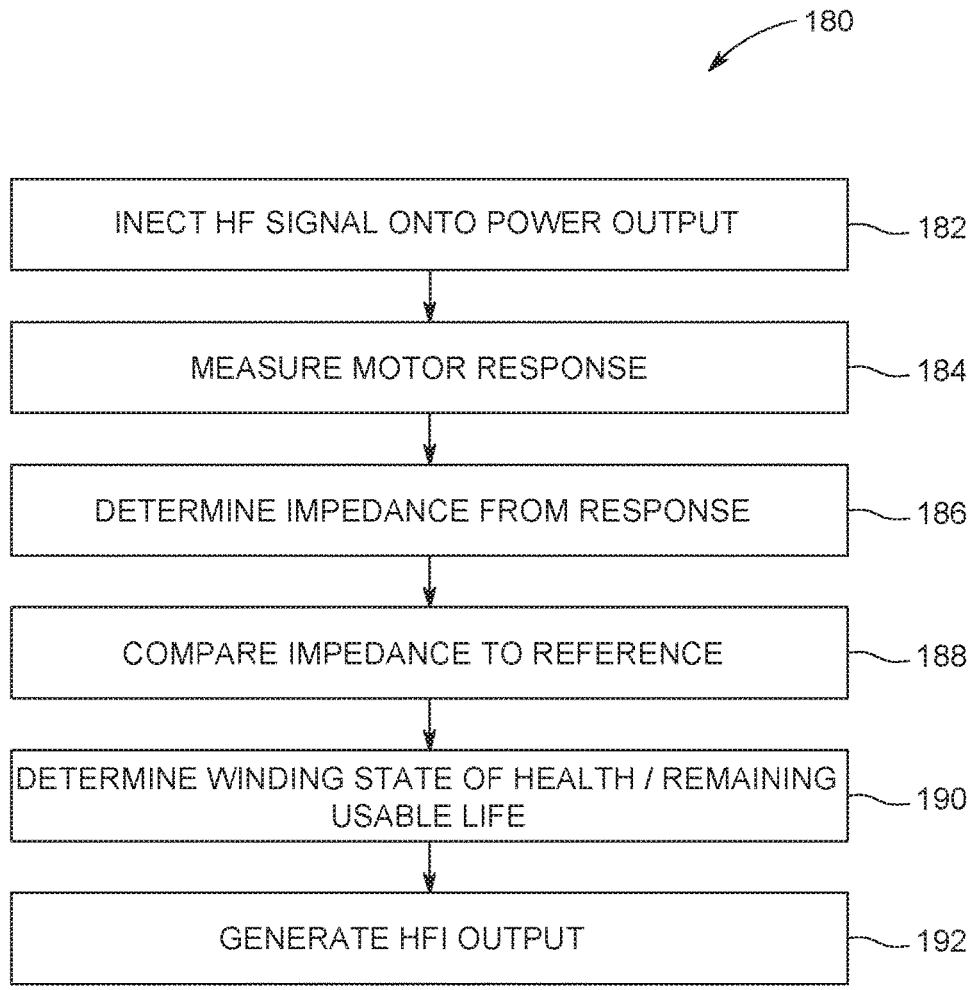
FIG. 6 is a flow chart of a method for using high frequency injection (HFI) to monitor the ESP assembly in accordance with aspects of the present disclosure.

As discussed above, embodiments of the dual drive system may inject, via the secondary VFD 60, high frequency signals into the power output through the cable 46 to generate a response from the motor 30. Additionally, embodiments of the virtual encoder system may inject, via a signal injection module 106, high frequency signals into the power output through the cable 46 to generate a response from the motor 30. FIG. 6 illustrates an HFI method 180 to determine the impedance of the ESP assembly 22. While it is understood that both the controller 62 of embodiments of the dual drive system and the controller 98 of embodiments of the virtual encoder system may utilize the HFI method 180 to monitor the operational status of the ESP assembly 22, the discussion of FIG. 6 below refers to the controller 62 of the virtual encoder system for conciseness.

The capacitance and dissipation factor (CNDF) of the motor 30 is of interest for monitoring the operational health of the motor 30. The controller 62 controls the secondary VFD 60 to inject (block 182) a known voltage or current signal at a relatively high frequency less than 100 kHz onto the power output provided to the motor 30 via the cable 46. In some embodiments, the controller 62 controls the injection of a known voltage or current signal at multiple relatively high frequencies less than 100 kHz. The controller 62 measures (block 184) the response of the motor via feedback received from the one or more sensors 48. The controller 62 determines (block 186) the impedance of motor 30 based at least in part on the received feedback. The controller 62 may receive the feedback continuously or at discrete times (e.g., periodic intervals, predetermined operating conditions, on demand) during operation of the ESP assembly 22.

The impedance of the motor 30 determined by the controller 62 is based at least in part on the ground-wall capacitance of the motor, which represents the capacitance between the motor windings and the electrically grounded laminations. As the ground-wall insulation ages, the capacitance between the motor windings and the laminations decreases, thereby reducing the impedance determined by the controller 62. In some embodiments, the controller 62 may compare (block 188) the impedance to a reference impedance. The reference impedance may include, but is not limited to a previously determined impedance for the ESP assembly 22 or a degradation model stored in memory 66. The controller 62 may determine (block 190) a winding state of health or an estimate of the remaining usable life of the motor 30 based at least in part on the comparison of the determined impedance. The controller 62 generates (block 192) an HFI output to an operator of the ESP assembly 22, an owner of the ESP assembly 22, a manufacturer of the ESP assembly 22, or a servicer of the ESP assembly 22, or any combination thereof. The HFI output may be provided via an audible message or tone, a visual indicator (e.g., light), a textual message on a display or printout (e.g., email, text message, report), or any combination thereof. Where the determined impedance is less than a predefined threshold impedance, the HFI output is an alert to the detection of the detected impedance. In some embodiments, the HFI output is the winding state of health or the estimate of the remaining usable life of the motor 30. Moreover, in some embodiments, the generated HFI output is an automated request for a replacement motor or a maintenance period to address the degradation of the insulation of the motor.

Technical effects of the disclosure include the use of monitoring and diagnostic algorithms for the ESA method and the HFI method with dual drive or virtual encoder embodiments of the ESP control system without additional elements to the ESP control system. The diagnostics alerts provided by the controller may increase the operational availability of the hydrocarbon extraction system through reducing unscheduled down time and proper maintenance of the components of the ESP assembly of the hydrocarbon extraction system. Additionally, the monitoring and diagnostic algorithms may be executed without affecting the control of the power output to the motor to maintain synchrony with a permanent magnet motor.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of controlling an electric motor assembly comprising:
   receiving sensor feedback that is based at least in part on electrical properties of a variable frequency power signal provided to the electric motor assembly;
   adjusting the phase angle of the variable frequency power signal provided to the electric motor assembly based at least in part on the sensor feedback, wherein adjusting the phase angle of the variable frequency power signal comprises controlling a secondary variable frequency drive to supplement the variable frequency power signal provided to the electric motor assembly from a primary variable frequency drive; and
   determining an operational status of the electric motor assembly that receives the variable frequency power signal based at least in part on the sensor.

2. The method of claim 1, wherein determining the operational status comprises electronic signature analysis (ESA) comparison of the sensor feedback to a baseline at frequencies of interest, wherein the baseline corresponds to a healthy operational status of the electric motor assembly.

3. The method of claim 2, wherein the frequencies of interest comprise at least one of a misalignment frequency and a rotor bar frequency of the electric motor assembly.

4. The method of claim 2, wherein the frequencies of interest comprise at least one of a rotordynamics natural frequency, a load natural frequency, or a bearing natural frequency.

5. The method of claim 2, comprising generating an output corresponding to a usable life of a component of the electric motor assembly based at least in part on the ESA comparison of the sensor feedback at the frequencies of interest.

6. The method of claim 1, wherein adjusting the phase angle of the variable frequency power signal comprises:
   determining a rotor position of a motor of the electric motor assembly from the sensor feedback; and
   transmitting a signal that corresponds to the determined rotor position to a primary variable frequency drive, wherein the primary variable frequency drive generates the variable frequency power signal based at least in part on the transmitted signal.

7. The method of claim 1, wherein the electric motor assembly comprises an electric submersible pump (ESP) assembly.

8. A control system comprising:
   a primary variable frequency drive (VFD) configured to receive power from a power source and to output a variable voltage and variable amplitude AC signal to a transformer configured to output a stepped up AC signal; and
   synchronization circuitry configured to receive the stepped up AC signal from the transformer and generate a variable output signal, wherein the synchronization circuitry comprises:
   one or more sensors configured to measure one or more electrical properties of the stepped up AC signal; and a controller coupled to the one or more sensors, wherein the controller is configured to directly adjust or to indirectly adjust the phase angle of the stepped up AC signal, wherein adjusting the phase angle of the variable frequency power signal comprises controlling a secondary variable frequency drive to supplement the variable frequency power signal provided to the electric motor assembly from a primary variable frequency drive, and the controller is configured to determine an operational status of an electric motor system that receives the AC signal based at least in part on the measured one or more electrical properties of the stepped up AC.

9. The control system of claim 8, wherein the synchronization circuitry comprises a secondary VFD configured to directly adjust the phase angle of the stepped up AC signal, wherein the secondary VFD is configured to provide a supplemental AC signal in addition to the stepped up AC signal to deliver to the electric motor system a full rated current for a period of time to keep the electric motor system from stalling.

10. The control system of claim 8, wherein the synchronization circuitry comprises a virtual encoder configured to indirectly adjust the phase angle of the stepped up AC signal via transmission of a signal to the primary VFD via a transmission link, the virtual encoder is configured to determine a rotor position of the electric motor system from the measured one or more electrical properties of the stepped up AC signal, and the signal transmitted to the primary VFD corresponds to the determined rotor position.

11. The control system of claim 8, wherein the controller is configured to compare the measured one or more electrical properties of the stepped up AC signal at frequencies of interest to a baseline to determine the operational status of the electric motor system.

12. The control system of claim 11, wherein the measured one or more electrical properties comprises a current of the stepped up AC signal, and the frequencies of interest comprise at least one of a misalignment frequency and a rotor bar frequency of the electric motor system.

13. The control system of claim 11, wherein the measured one or more electrical properties comprises a current of the stepped up AC signal, and the frequencies of interest comprise at least one of a rotordynamics natural frequency, a load natural frequency, or a bearing natural frequency.

14. A non-transitory computer readable media comprising instructions to be executed by a processor of an electric motor control system, wherein the instructions comprise instructions to:
receive sensor feedback that is based at least in part on electrical properties of a variable frequency power signal provided to an electric motor assembly;
adjust the phase angle of the variable frequency power signal provided to the electric motor assembly based at least in part on the sensor feedback, wherein instructions to adjust the phase angle of the variable frequency power signal comprises control of a secondary variable frequency drive to supplement the variable frequency power signal provided to the electric motor assembly from a primary variable frequency drive; and
determine an operational status of the electric assembly that receives the variable frequency power signal based at least in part on the sensor.

15. The non-transitory computer readable media of claim 14, wherein instructions to determine the operational status comprise instructions to execute an electronic signature analysis (ESA) comparison of the sensor feedback to a baseline at frequencies of interest, wherein the baseline corresponds to a healthy operational status of the electric motor assembly, and the frequencies of interest comprise at least one of a misalignment frequency and a rotor bar frequency of the electric motor assembly.

16. The non-transitory computer readable media of claim 15, comprising instructions to generate an output corresponding to a usable life of a component of the electric motor assembly based at least in part on the ESA comparison of the sensor feedback at the frequencies of interest.

17. The non-transitory computer readable media of claim 14, wherein instructions to adjust the phase angle of the variable frequency power signal comprise instructions to:
determine a rotor position of a motor of the electric motor assembly from the sensor feedback; and
transmit a signal that corresponds to the determined rotor position to a primary variable frequency drive, wherein the primary variable frequency drive generates the variable frequency power signal based at least in part on the transmitted signal.

* * * * *